United States Patent [19]

Hartmeier

[11] Patent Number: 4,777,385
[45] Date of Patent: Oct. 11, 1988

[54] SIGNAL TRANSIENT IMPROVEMENT CIRCUIT

[75] Inventor: Werner N. Hartmeier, Geroldswil, Switzerland

[73] Assignee: RCA Licensing Corporation, Princeton, N.J.

[21] Appl. No.: 12,392

[22] Filed: Feb. 9, 1987

[51] Int. Cl.$^4$ .......................... H03K 5/12; H03K 6/04
[52] U.S. Cl. .................... 307/263; 307/517; 328/55; 328/109
[58] Field of Search .......................... 358/31, 37, 166; 307/517, 263, 518, 268, 358, 360, 361; 328/55, 153, 154, 109, 110, 155

[56] References Cited

U.S. PATENT DOCUMENTS

| | | | |
|---|---|---|---|
| 3,778,543 | 12/1973 | Lowry | 328/55 |
| 4,290,022 | 9/1981 | Puckette | 328/55 |
| 4,330,750 | 5/1982 | Mayor | 328/55 |
| 4,538,178 | 8/1985 | Bolger | 358/166 |
| 4,553,042 | 11/1985 | Batterman | 307/263 |
| 4,637,018 | 1/1987 | Flora et al. | 371/1 |

OTHER PUBLICATIONS

Hartmut Harlos, "Picture Signal Improvement in Color TV Receivers", IEEE Trans. on Consumer Elect., vol. CE-31, No. 3; Aug. 85, pp. 156-162.

Primary Examiner—Stanley D. Miller
Assistant Examiner—Timothy P. Callahan
Attorney, Agent, or Firm—Eugene M. Whitacre; Paul J. Rasmussen; Eric P. Herrmann

[57] ABSTRACT

A transition enhancing circuit includes a tapped delay line which provides successively delayed replicas of the signal to be processed. A multiplexer, responsive to a signal transition, sequentially couples delayed signal from the center tap and taps more distant from the input of the delay line to an output terminal to effectively hold the initial value of the transition for approximately half the transition period. The taps at the input end of the delay line up to and including the center tap are then sequentially coupled to the output terminal to effectively advance, in time, the end value of the signal transition. The signal transition is thereby reduced to a time equivalent to the switching interval between taps.

5 Claims, 1 Drawing Sheet

SIGNAL TRANSIENT IMPROVEMENT CIRCUIT

This invention relates to circuitry for signal transition improvement which is useful, for example, for enhancing chrominance signals in a color television receiver.

BACKGROUND OF THE INVENTION

Signal transition enhancement circuitry for use in color television signal processing apparatus is known from, for example, U.S. Pat. No. 4,553,042 and the article by Hartmut Harlos, "Picture Signal Improvement In Colour TV Receivers", published in the IEEE Transactions on Consumer Electronics, Vol. CE-31, No. 3, August 1985, both of which are incorporated herein by reference. The Harlos article describes an analog processing approach to transition enhancement and U.S. Pat. No. 4,553,042 describes primarily a digital approach to transition enhancement. In both systems, signal transitions having slopes greater than a predetermined value are detected. Responsive to the detected transitions, circuitry is employed to hold the initial amplitude value of the transition for substantially the duration of the transition and thereafter the final value of the signal transition is coupled to the signal output device. The transition is shortened to the time required to switch between the initial and final values of the transition, which time is typically much shorter than the original transition time. The Harlos system accomplishes this function by incorporating a series switch in the signal path followed by a storage capacitor having one terminal coupled to a point of fixed potential. The series switch is maintained closed until a transition is detected, at which time the switch is opened. The value of the signal at the beginning of the transition is stored on the capacitor and output to further processing circuitry. A predetermined time after the switch is opened it is returned to the closed condition to couple the incoming signal to the capacitor and the further processing circuitry.

In U.S. Pat. No. 4,553,042, input signal, represented by, for example, binary samples, is applied to a serial shift register. Responsive to the detection of a signal transition, samples are routed around ones of the shift register stages to effectively eliminate samples representing the transition per se. The eliminated samples are replaced with samples representing the end points of the transition so that the output of the shift register developes the signal transition in one sample period which is substantially faster than the original transition time.

A disadvantage of both of the aforedescribed systems is that they tend to delay the point in time that the transition occurs. A TV receiver that has such circuitry incorporated in the chrominance signal path must include compensating delay circuitry in its luminance signal path to account for the additional chrominance signal delay.

It is an object of the present invention to provide signal transition enhancement circuitry with reduced delay in the signal path.

SUMMARY OF THE INVENTION

The present signal transition enhancement circuitry includes a delay circuit to which the signal is applied. The delay circuit has a plurality of output terminals at which signals delayed by different time periods are provided. The delayed signals are coupled to multiplexing circuitry, the output terminal of which provides the enhanced signal. The multiplexer is conditioned by a transition detection signal, to couple input samples from the delay circuit to its output terminal in a predetermined sequence. Nominally, when no signal transitions occur, the multiplexer is conditioned to couple an intermediate one of the plurality of output terminals to its output terminal.

DETAILED DESCRIPTION

This invention may be realized in either analog or digital form with the appropriate choice of delay and multiplexer elements. Thus, the interconnections may be single conductors (for the case of analog circuitry) or multiple conductor busses (for the case of parallel bit digital circuitry). Depending upon the choice of circuit elements, additional compensating delay elements may be required between certain circuit elements, however, one skilled in the art of circuit design will readily be able to include such elements.

Consider a color television system. In such a system, two signals, a luminance signal and a chrominance signal, are generated and processed. Both of these signals are derived from red, green and blue image information signals from, for example, a color TV camera. The chrominance signal is a combination of two color difference signals that are ultimately separated and processed in a TV receiver. The luminance and chrominance components being derived from the same signals originally have like bandwidths. However, because the eye is less sensitive to color than it is to luminance, the chrominance information is band limited in order that color video signals can ee transmitted in the same channel frequency space as black and white video signals, that is in order to be backwards compatible with black and white broadcast signals.

Band limiting the chrominance signal tends to lengthen its high frequency signal transitions relative to corresponding transitions in the luminance signal. This mismatch of transitions between luminance and chrominance signals tends to blur edges of reproduced images and/or to produce incorrect colors along edges of the reproduced images. Thus, it is desirable to enhance chrominance signal transitions that have been stretched by band limiting the signal. Typically, the transition enhancement is performed on demodulated baseband color difference signal chrominance signal components.

Figure 2:
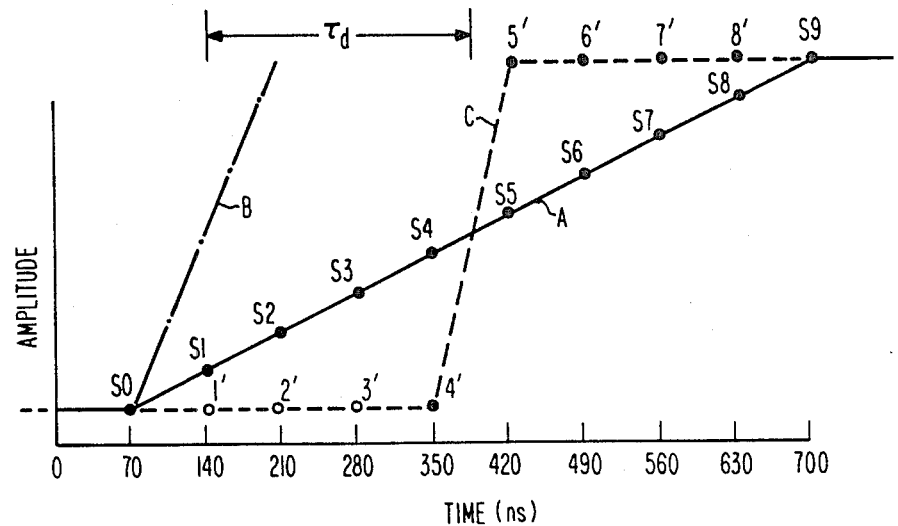
FIG. 2 is a time versus amplitude waveform drawing useful in describing the invention.

Referring to FIG. 2, waveform A is intended to represent a signal transition that has undergone band limiting. Signal transitions having a slope less than the slope of waveform A are considered to generally be unaffected by band limiting. Signal transitions originally having slopes greater than waveform A are considered to be band limited to a slope approximating the slope of waveform A. If the signal is sampled at a rate of four times the color subcarrier frequency (sample periods of 70 ns for NTSC signals) the fastest possible, non-band-limited transition is represented by waveform B. Thus, waveform A may, to a coarse approximation, represent any transition having a slope falling between waveform B and waveform A.

The transition enhancement circuit to be described will locate the enhanced transition at approximately the midway point of the transition of waveform A. If waveform A is a band limited representation of waveform B, then the enhanced transition is displaced by the interval $\tau_d$. It will be readily appreciated that to match luminance transitions with corresponding enhanced chrominance transitions, the luminance signal should be delayed by the displacement interval. Since the displacement interval varies, the luminance delay may be selected to equal the mean value of the possible displacement intervals, i.e. approximately 140 ns for the illustrative example. If corresponding luminance transition slopes are detected, it is possible, with variable delay lines, to make the compensating luminance delay period substantially equal to the displacement interval, at least to within one-half of one sample interval. Note in the illustrative example the chrominance channel is arbitrarily assumed to be band limited to approximately 650 kHz (measured between the 10% to 90% points).

Those persons skilled in the art of video signal processing will appreciate that R-Y and B-Y color difference signals are band limited to approximately 500 kHz and that wideband I color difference signals are band limited to approximately 1.3 MHz. Thus, depending on the actual bandwidth of the signals being processed, the number of sample delays used in the transition enhancement apparatus must be selected accordingly. In addition, the enhanced transition will occur midway between the actual transition only for transitions having the amplitude/duration illustrated in FIG. 2 (waveform A). If the amplitude/duration of the actual transition is greater or lesser than that illustrated in waveform A, the enhanced transition may occur subsequent and prior to the midway point respectively. Nominally, the displacement will occur within one sample period of the midpoint if the system components are selected to accommodate the average amplitude/duration of the band limited transitions.

In FIG. 2, waveform C represents the enhanced signal transition corresponding to waveform A. Waveform C is produced by holding the value of sample S0 (time=70 ns) for four sample periods and then advancing the value at sample S9 (t=700 ns) by four sample periods and holding this value for four sample periods at which time the system outputs the incoming signal unaltered.

Figure 1:
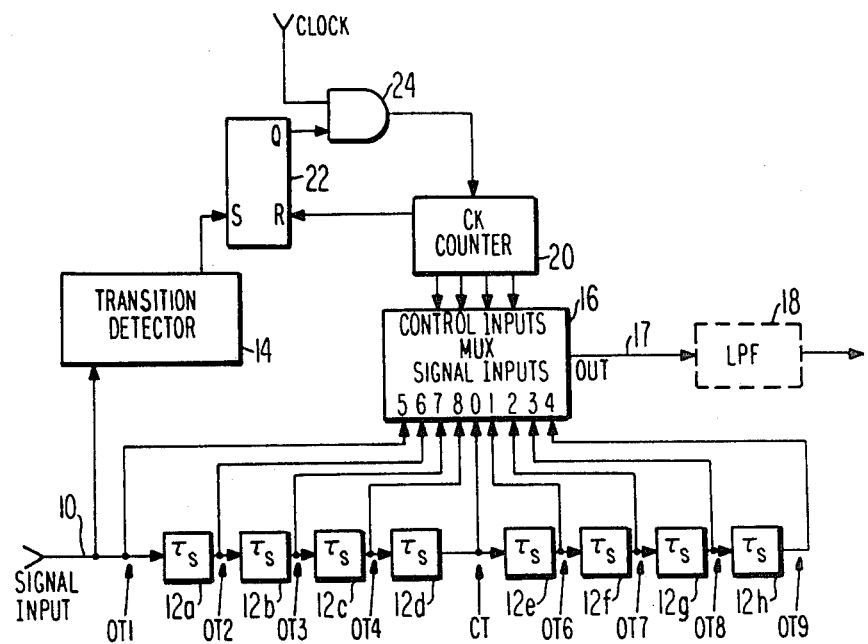
FIG. 1 is a block diagram of a signal transition enhancement apparatus embodying the present invention.

Referring to FIG. 1, the signal which is subject to transition enhancement is applied at terminal 10. In a TV receiver, for example, this signal may be one of the color difference signals derived from a chrominance signal demodulator. The input signal is coupled to a shift register including the cascade connected delay stages 12a-12h. The input signal is presumed to be a pulse code modulated digital signal occurring at a sample rate of four times the color subcarrier thus, the delay stages may be realized with, e.g. parallel bit, binary latches, which latches are clocked synchronously with the input sample rate. If the input signal were an analog signal, the shift register may be preceded with a sample-and hold circuit, and the shift register may be realized with charge transfer devices (CTD's).

In the illustrative embodiment, each delay stage delays the applied signal by one sample period $\tau_s$. Signal samples are accessed at output taps OT1–OT9 located at the input to the first delay stage and at the output of all of the delay stages. The nine output taps OT1--T9 are coupled to a nine-to-one multiplexer 16. Multiplexer 16, responsive to control input signals from counter 20, selectively couples the samples provided from output taps OT1–OT9 to its output connection 17.

The input signal at connection 10 is also applied to a signal transition detector 14 which may be similar to the transition detectors described in the aforementioned references. Transition detector 14 provides an output signal upon the detection of a signal transition having a slope of magnitude greater than a predetermined value. The output signal from the transition detector is applied to the set input of the set-reset flip-flop 22. Flip-flop 22 responsive to the output signal from the transition detector enables AND gate 24 to pass a clocking signal, CLOCK, to a clock input, CK, of counter 20.

The signal CLOCK provides pulses synchronous with the occurrence of input samples at input 10. The clock pulses may occur at the sample rate or a multiple or submultiple of the sample rate depending upon the particular application. Responsive to the signal CLOCK, counter 20 also provides a reset signal after counting nine clock pulses, which reset signal is applied to the reset input, R, of flip-flop 22. Responsive to the reset signal, flip-flop 22 disables the AND gate 24 inhibiting counter 20 until the occurrence of the next detected signal transition.

Counter 20 is arranged to count from 0-8 and resets to 0 concurrently with AND gate 24 being disabled. Multiplexer 16 is responsive to the count values provided by counter 20 to couple its corresponding input terminals 0-8 to its output terminal 17. Consequently multiplexer 16, in the absence of detected signal transitions, couples the center tap, CT, of the shift register to the output terminal 17. When a transition is detected and counter 20 sequences through the count values 0-8, multiplexer 16 sequentially couples its corresponding input terminals 0-8 (and back to 0) to its output connection. Thus, when a transition is detected, the sequence of samples applied to output terminal 17 are accessed from taps CT, OT6, OT7, OT8, OT9, OT1, OT2 OT3 and OT4 in the recited order.

The system is arranged with sufficient delay in the transition detection circuitry such that counter 20 does not start sequencing through its count values until the beginning of the signal transition is available at the center tap, CT, of the shift register. Successively accessing samples from taps CT, OT6, OT7, OT8, OT9, at the sample rate corresponds to sampling the same sample value for five sample periods or holding the initial value for five sample intervals. Effectively, the sample occurring at time 70 ns is held until time 350 ns in FIG. 2. After accessing tap OT9, multiplexer 16 switches to tap OT1.

When multiplexer 16 accesses the sample at tap OT9 the entire signal transition is resident in the shift register. The samples designated S0–S8 in FIG. 1 are available at taps OT9, OT8, OT7, OT6, CT, OT4, OT3, OT2 and OT1, respectively. During the sample period after the multiplexer accesses tap OT9, all sample values are shifted rightward in the register and concurrently multiplexer 16 accesses the sample at tap OT1. At this time, the sample designated S9 in FIG. 2 is available at tap OT1. During the subsequent four clock cycles (sample periods) the sample S9 is shifted through delay stages 12a-12d and multiplexer 16 successively accesses, at the sample rate, taps OT2, OT3, OT4 and CT. The sample designated S9, which corresponds to the end point of the signal transition is thus output for five sample periods. At this time the counter automatically resets inhibiting the scanning action of the multiplexer and the successive signal samples occurring at the center tap are provided to the output 17.

When the enhanced signal transition occurs across one sample period of a four times subcarrier sample rate, the transition is faster than the bandwidth of a TV receiver system allows. Therefore, it may be desirable to include a low-pass filter 18 in the signal output path. Alternatively, the counter 20 may be arranged to substitute the count value of 0 for the count value 5 during the counting sequence, and then continue the count from 6–8 in normal fashion. In this instance, the output signal, during a transition, would consist of five samples of the initial value of the transition, the sample value of the midpoint of the transition and four samples of the end value of the transition. The enhanced transition would now occur over two sample periods, and have less bandwidth than the transition enhanced over one sample period.

Another alternative arrangement which simplifies the circuitry is to substitute a five-to-one multiplexer for multiplexer 16. In this instance, output taps OT1, OT3, CT, OT7 and OTg would be coupled to the five multiplexer input terminals 3, 4, 0, 1 and 2 respectively. Counter 20 in this instance would be a modulo 5 counter arranged to count clock pulses occurring at one-half the sample rate. The output samples before the enhanced transition would switch between the value of samples S0 and S1 and the output samples after the enhanced transition would switch between the value of sample S9 and the next successive sample value. This modulation of the output signal, which is undesirable, is substantially eliminated by the low-pass filter 18.

The circuitry illustrative example is designed to enhance transitions of signal frequency band limited to approximately 650 kHz. For signals which are band limited to lower or higher frequencies more or less shift register stages will be required respectively. The size of the multiplexer and counter will be changed accordingly.

It is contemplated that variations on the system may readily be implemented without straying from the spirit of the invention. For example, a transition detector may be utilized which calculates the duration of each transition and programs the multiplexer to sequence the delayed samples such that the enhanced transition always occurs at the midpoint of the band limited transition. In addition, in the environment of a TV receiver, the transition detector may be designed to respond to signal transitions in both the chrominance channel and the luminance channel. Further, in the context of video signal processing, the invention may be implemented to enhance luminance transitions in, for example, a video cassette recorder.

What is claimed is:

1. Signal transition enhancement apparatus comprising:
    a signal input terminal for receiving an input signal;
    a signal output terminal;
    a serial-input-parallel-output register having an input terminal coupled to said signal input terminal and having a plurality of output terminals wherein a different signal delay is provided between said input terminal and each of said plurality of output terminals;
    a signal transitin detector coupled to said signal input terminal, for generating a control signal on the occurrence of signal transitions;
    multiplexing means, having a plurality of input connections coupled to said plurality of output terminals, having an output terminal coupled to said signal output terminal, said multiplexing means being responsive to control values to selectively couple said plurality of output terminals to said signal output terminal;
    a counter responsive to said control signal for generating a predetermined sequence of values at a predetermine rate, said sequence of values being applied to the control input terminal of said multiplexing means for conditioning said multiplexing means to selectively couple to said signal output terminal a predetermined sequence of ones of said plurality of output terminals, said sequence starting with an intermediate one of said plurality of output terminals, then ones of said plurality of output terminals which provide greater signal delays than said intermediate one, then ones of said plurality of output terminals which provide lesser signal delays than said intermediate one, and then said intermediate one, and wherein the absence of said control signal said intermediate one of said plurality of output terminals is coupled to said signal output terminal.

2. The apparatus set forth in claim 1 wherein said multiplexing means further includes a low-pass filter coupled between said multiplexer and said signal output terminal.

3. The apparatus set forth in claim 1 wherein n parallel outputs, n, being an integer, are connected from said shift register to said multiplexer and said counter is a modulo n counter.

4. The apparatus set forth in claim 5 wherein said n parallel outputs are ordinally numbered, one to n, and the signal delay provided by successively numbered ones of the parallel outputs increases in equal increments,
    one of said ordinally numbered outputs having a number closest to the value $(n+1)/2$ is coupled by said multiplexing means to said signal output terminal in the absence of said control signal.

5. The apparatus set forth in claim 4 wherein said multiplexing means, responsive to the values generated by said counter, couples the n parallel outputs to said signal output terminal in the order of: said output numbered closest to the value $(n+1)/2$, to successively increasing output numbers up to n, then to the output numbered one, followed by successively increasing output numbers up to and including said output numbered closest to the value $(n+1)/2$.

* * * * *

UNITED STATES PATENT AND TRADEMARK OFFICE
CERTIFICATE OF CORRECTION

PATENT NO. : 4,777,385

DATED : October 11, 1988

INVENTOR(S) : Werner Niklaus Hartmeier

It is certified that error appears in the above-identified patent and that said Letters Patent is hereby corrected as shown below:

Column 5, line 22, change "OTg" to --OT9--.

Column 6, line 5, change "transitin" to --transition--.

Column 6, line 8, change "pluraity" to --plurality--.

Column 6, line 24 change "pluraity" to --plurality--.

Signed and Sealed this

Seventh Day of March, 1989

Attest:

DONALD J. QUIGG

Attesting Officer  Commissioner of Patents and Trademarks